(12) United States Patent
Torii et al.

(10) Patent No.: US 10,467,090 B2
(45) Date of Patent: Nov. 5, 2019

(54) MEMORY CONTROLLER AND DECODING METHOD

(71) Applicant: Toshiba Memory Corporation, Minato-ku (JP)

(72) Inventors: Osamu Torii, Setagaya (JP); Haruka Obata, Ohta (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 21 days.

(21) Appl. No.: 15/259,690

(22) Filed: Sep. 8, 2016

(65) Prior Publication Data

US 2017/0257122 A1    Sep. 7, 2017

Related U.S. Application Data

(60) Provisional application No. 62/302,401, filed on Mar. 2, 2016.

(51) Int. Cl.
*H03M 13/37* (2006.01)
*G06F 11/10* (2006.01)
(Continued)

(52) U.S. Cl.
CPC ..... *G06F 11/1012* (2013.01); *H03M 13/2909* (2013.01); *H03M 13/2927* (2013.01);
(Continued)

(58) Field of Classification Search
CPC .............. H03M 13/116; H03M 13/118; H03M 13/3753; H03M 13/3746; H03M 13/3738;
(Continued)

(56) References Cited

U.S. PATENT DOCUMENTS 6,922,446 B1    7/2005  Chouly et al.
7,093,179 B2    8/2006  Shea
(Continued)

FOREIGN PATENT DOCUMENTS

JP    11-215012    8/1999
JP    2010-505200    2/2010

OTHER PUBLICATIONS

William Ryan, et al., "Channel Codes :Classical and Modern", Cambridge University Press, Sep. 17, 2009, 5 Pages.
Nong Le, et al., "Distance-Based Decoding of Block Turbo Codes", IEEE Communications Letters, vol. 9, No. 11, Nov. 2005, 3 Pages.

*Primary Examiner* — Samir W Rizk
*Assistant Examiner* — Enam Ahmed
(74) *Attorney, Agent, or Firm* — Oblon, McClelland, Maier & Neustadt, L.L.P.

(57) ABSTRACT

A memory controller according to an embodiment includes a first decoder which calculates first extrinsic value based on a decoding success rate specified using a first table showing a correspondence between first distance information indicating a square Euclidean distance between a first decode word and a first soft input value and a first decoding success rate indicating a probability of a decoding result that the first decode word is correct, and a second decoder which calculates second extrinsic value based on a decoding success rate specified using the second table showing a correspondence second distance information indicating a square Euclidean distance between a second decode word and a second soft input value and a second decoding success rate indicating a probability of a decoding result that the second decode word is correct.

16 Claims, 8 Drawing Sheets

(51) Int. Cl.
*H03M 13/29* (2006.01)
*H03M 13/09* (2006.01)
*H03M 13/15* (2006.01)

(52) U.S. Cl.
CPC ... *H03M 13/3707* (2013.01); *H03M 13/3738* (2013.01); *H03M 13/3746* (2013.01); *H03M 13/3753* (2013.01); *H03M 13/09* (2013.01); *H03M 13/152* (2013.01); *H03M 13/1515* (2013.01)

(58) Field of Classification Search
CPC ......... H03M 13/2927; H03M 13/2909; H03M 13/3707; H03M 13/09; H03M 13/152; H03M 13/1515; H03M 13/6356; H03M 13/1102; H03M 13/353; G06F 11/10; G06F 11/1076; G06F 11/1012; H04L 1/0068; H04L 1/0057; H04L 1/0041
USPC ....................................................... 714/780
See application file for complete search history.

(56) References Cited

U.S. PATENT DOCUMENTS

| | | | |
|---|---|---|---|
| 7,440,208 B1* | 10/2008 | McEwen | G11B 20/10009 360/31 |
| 7,805,663 B2 | 9/2010 | Brandman et al. | |
| 8,935,598 B1* | 1/2015 | Norrie | H03M 13/6583 375/262 |
| 9,213,602 B1* | 12/2015 | Alhussien | G06F 11/1068 |
| 2003/0126551 A1* | 7/2003 | Mantha | H03M 13/1102 714/790 |
| 2008/0250300 A1* | 10/2008 | Mokhlesi | G11C 11/5642 714/780 |
| 2010/0031113 A1* | 2/2010 | Chang | H04L 25/03242 714/752 |
| 2012/0054576 A1* | 3/2012 | Gross | H03M 13/1117 714/752 |
| 2015/0242268 A1* | 8/2015 | Wu | G06F 11/1012 714/773 |

* cited by examiner

DISTANCE INFORMATION

MEMORY CONTROLLER AND DECODING METHOD

CROSS-REFERENCE TO RELATED APPLICATIONS

This application is based upon and claims the benefit of priority from U.S. Provisional Application No. 62/302,401, filed on Mar. 2, 2016; the entire contents of which are incorporated herein by reference.

FIELD

Embodiments described herein relate generally to a memory controller and a decoding method.

BACKGROUND

In a storage device, data is generally stored by being encoded using an error correcting code in order to protect the storing data. As an example of the encoding using the error correcting code, there is known a product code in which a code word is generated in two dimensions.

DETAILED DESCRIPTION

According to embodiments described below, a memory controller includes a soft decision decoder. The soft decision decoder includes a first decoder which stores a first table, the first table showing a correspondence between first distance information indicating a square Euclidean distance between a first decode word and a first soft input value and a first decoding success rate indicating a probability of a decoding result that the first decode word is correct, calculates the first distance information based on a first word read as a soft decision value from nonvolatile memory, specifies the first decoding success rate associated to the first distance information from the first table, calculates first extrinsic value based on the first decoding success rate, and outputs the first extrinsic value, and a second decoder which stores a second table, the second table showing a correspondence between second distance information indicating a square Euclidean distance between a second decode word and a second soft input value and a second decoding success rate indicating a probability of a decoding result that the second decode word is correct, calculates the second distance information based on an addition result of a second word read as a soft decision value from the nonvolatile memory and the first extrinsic value, specifies the second decoding success rate associated to the second distance information from the second table, calculates second extrinsic value based on the second decoding success rate, and outputs the second extrinsic value. A minimum value of the first decoding success rate registered in the first table is a first non-zero value, and a minimum value of the second decoding success rate registered in the second table is a second non-zero value.

Hereinafter, a memory controller and a decoding method according to embodiments will be described in detail with reference to the accompanying drawings. Further, the invention is not limited by these embodiments.

First Embodiment

Figure 1:
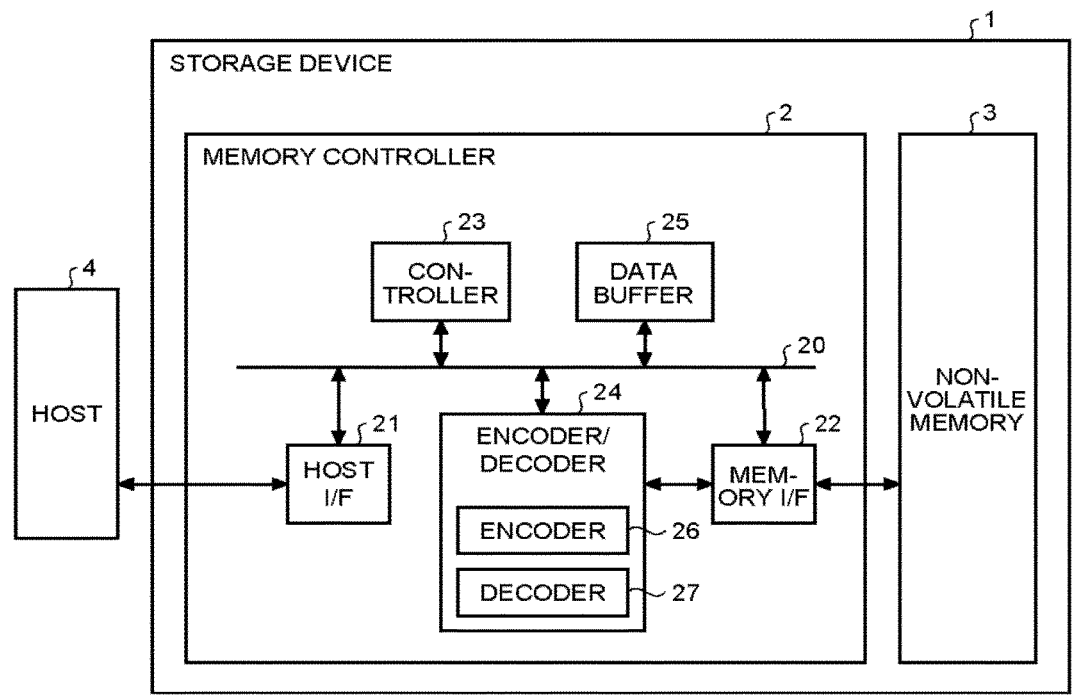
FIG. 1 is a block diagram illustrating an exemplary configuration of a storage device according to a first embodiment.

FIG. 1 is a block diagram illustrating an exemplary configuration of a storage device according to a first embodiment. A storage device 1 of the first embodiment includes a memory controller 2 and nonvolatile memory 3. The storage device 1 is connectable to a host 4, and FIG. 1 illustrates a state of the connection with the host 4. The host 4 is, for example, an electronic device such as a personal computer or a portable terminal.

The nonvolatile memory 3 is nonvolatile memory for storing data in a nonvolatile manner (for example, NAND memory). Further, the description herein will be made about an example using the NAND memory as the nonvolatile memory 3. As the nonvolatile memory 3, a storage unit other than the NAND memory, such as flash memory having a three-dimensional structure, ReRAM (Resistance Random Access Memory), and FeRAM (Ferroelectric Random Access Memory), may be used. In addition, the description herein will be made about an example using semiconductor memory as the storage unit. An error correction process of the first embodiment may be applied to the storage device using a storage unit other than the semiconductor memory.

The storage device 1 may be a memory card in which the memory controller 2 and the nonvolatile memory 3 are configured as one package, or may be an SSD (Solid State Drive).

The memory controller 2 controls writing on the nonvolatile memory 3 according to a write command (request) from the host 4. In addition, the memory controller 2 controls reading from the nonvolatile memory 3 according to a read command from the host 4. The memory controller 2 includes a Host I/F (a host interface) 21, a memory I/F (a memory interface) 22, a controller 23, an encoder/decoder 24, and a data buffer 25. The Host I/F 21, the memory I/F 22, the controller 23, the encoder/decoder 24, and the data buffer 25 are connected to an internal bus 20.

The Host I/F 21 performs a process according to an interface standard with respect to the host 4, and outputs a command and user data received from the host 4 to the internal bus 20. In addition, the Host I/F 21 transmits the user data read from the nonvolatile memory 3 and a response from the controller 23 to the host 4. Further, in the first embodiment, data written to the nonvolatile memory 3 in response to a write request from the host 4 is called the user data.

The memory I/F 22 performs a write process to the nonvolatile memory 3 based on an instruction of the controller 23. In addition, based on the instruction of the controller 23, the memory I/F 22 performs a read process from the nonvolatile memory 3.

The controller 23 is a controller which collectively controls the respective components of the storage device 1. When receiving a command from the host 4 through the Host I/F 21, the controller 23 performs control according to the command. For example, the controller 23 instructs the memory I/F 22 to write the user data and parity into the nonvolatile memory 3 according to the command from the host 4. In addition, the controller 23 instructs the memory I/F 22 to read the user data and the parity from the nonvolatile memory 3 according to the command from the host 4.

In addition, when receiving the write request from the host 4, the controller 23 determines a storage region (memory region) on the nonvolatile memory 3 with respect to the user data accumulated in the data buffer 25. In other words, the controller 23 manages a write address of the user data. A correspondence between a logical address of the user data received from the host 4 and a physical address indicating the storage region on the nonvolatile memory 3 storing the user data is stored as an address translation table.

In addition, when receiving a read request from the host 4, the controller 23 translates the logical address designated by the read request into the physical address using the above-described address translation table, and instructs the memory I/F 22 to read the data from the physical address.

In the NAND memory, reading and writing are generally performed in a unit of data called a page, and erasing is performed in a unit of data called a block. In the first embodiment, a plurality of memory cells connected to the same word line is called a memory cell group. In a case where the memory cell is a single-level cell (SLC), one memory cell group corresponds to one page. In a case where the memory cell is a multi-level cell (MLC), one memory cell group corresponds to a plurality of pages. In addition, each memory cell is connected to the word line and also to a bit line. Each memory cell can be identified by an address for identifying the word line and an address for identifying the bit line.

The data buffer 25 temporarily stores the user data received by the memory controller 2 from the host 4 until the user data is stored into the nonvolatile memory 3. In addition, the data buffer 25 temporarily stores the user data read from the nonvolatile memory 3 until the user data is transmitted to the host 4. The data buffer 25 is configured by, for example, a general purpose memory such as SRAM (Static Random Access Memory) or DRAM (Dynamic Random Access Memory).

The user data transmitted from the host 4 is delivered to the internal bus 20 and stored in the data buffer 25. The encoder/decoder 24 encodes the data stored in the nonvolatile memory 3 to generate a code word. The encoder/decoder 24 includes an encoder 26 and a decoder 27. The encoding and the decoding of the first embodiment will be described in detail below.

In general, there is known a method of protecting the storing data using an error correcting code in the storage device. As a specific error correcting code, for example, a code containing a plurality of constraint conditions such as a product code made by combining block codes and a concatenated code may be used.

In general, as a decoding method, there are a HIHO (hard-input hard-output) decoding and a SISO (soft-input soft-output) decoding. The SISO decoding has an error correction capability higher than the HIHO decoding but requires a longer processing time. Even in a case where the product code is used, the HIHO decoding may be performed at the time of decoding, or the SISO decoding may be performed. In a case where the SISO decoding is performed, for example, when the product code configured by a code word group of two dimensions (a first dimension (horizontal direction) and a second dimension (vertical direction)), there is repeatedly performed a process of obtaining first extrinsic value by performing the SISO decoding of a first-dimensional code, obtaining second extrinsic value by performing the SISO decoding of a second-dimensional code using the first extrinsic value, obtaining the first extrinsic value by performing the SISO decoding of the first-dimensional code using the second extrinsic value, . . . and so on. In this way, the error correction capability can be improved by exchanging the extrinsic value between the decoding processes of the different dimensional codes. Further, the extrinsic value is a value indicating a probability.

Herein, the description will be made about a correspondence of terminologies (channel value, a priori value, a posteriori value, and extrinsic value) generally used in a soft decision decoding with respect to the data stored in the storage device 1 of the first embodiment. When the data is read from the nonvolatile memory 3, a threshold determining process is performed plural times while changing a read level to obtain a range where a threshold voltage value of each memory cell falls. The obtained range is denoted as a parameter "a". A logarithm of a ratio of a conditional probability $P(a|x=0)$ that the threshold voltage value falls within the range "a" on condition that a write bit "x" to each memory cell is logical 0 to a conditional probability $P(a|x=1)$ that the threshold voltage value falls within the range "a" on condition that the write bit "x" of each memory cell is logical 1, is called channel value in this description. When expressed as a formula, the channel value can be expressed as $\ln(P(a|x=0)/P(a|x=1))$. Herein, "ln" represents a natural logarithm.

It is assumed that a vector X, which is write data containing a plurality of bits, is configured by one code word of a certain error correcting code. Herein, the expression "X∈C" indicates that the vector X is one code word of a certain error correcting code C. In a case where a probability $P(x=0)$ that each bit x is 0 and a probability $P(x=1)$ that each bit x is 1 are known from a condition other than the above-described code constraint C and the read threshold voltage range "a", the logarithm of the ratio of these probabilities is called "a priori value" in the description. When expressed as a formula, the a priori value becomes $\ln(P(x=0)/P(x=1))$.

In general, the soft decision decoding is a method of obtaining the vector X that maximizes an a posteriori probability $P(X \in C|A)$ on conditions that a vector A which corresponds to the code word of the code constraint C and has the read threshold voltage range as an element, the conditional probability $P(A|x)$ of the channel, and (when obtained already) a vector of the a priori value are given, or a method of giving an approximate solution.

In addition, under a condition that the vector A is received, the logarithm of the ratio of the conditional probability $P(x=0, X \in C|A)$ that the write bit x of each memory cell is 0 and the conditional probability $P(x=1, X \in C|A)$ that the write bit of each memory cell is 1, is called a posteriori value in the description. When expressed as a formula, the a posteriori value becomes $\ln(P(x=0, X\in C|A)/P(x=1, X\in C|A))$.

A value obtained by subtracting (channel value+a priori value) from the a posteriori value with respect to each bit is called extrinsic value.

Similarly to the product code, in a case where a certain bit belongs to a plurality of code constraints, the extrinsic value obtained based on a certain code constraint can be used as the a priori value when the soft decision decoding is performed based on another code constraint to which the bit belongs.

On the other hand, there are various methods of calculating the extrinsic value. For example, there is a method of calculating the extrinsic value according to the following Equation (1) using a decoding success rate φ. Herein, the decoding success rate φ indicates a probability that a decoding result (a decode word) of the soft decision decoding is correct (that is, the decode word is the same as the transmitted code word).

$$exLLR_j = d_j \left( \ln \left( \frac{\phi + \exp(d_j(chLLR_j + prLLR_j))}{1 - \phi} \right) \right) - (chLLR_j + prLLR_j) \quad (1)$$

Further, when the code length of the transmitted code word is "n", $chLLR_j$ indicates a j-th element of the vector $\{chLLR_1, chLLR_2, \ldots, chLLR_n\}$ of the channel value, and $prLLR_j$ indicates a j-th element of the vector $\{prLLR_1, prLLR_2, \ldots, prLLR_n\}$ of the a priori value. $d_j$ indicates a j-th element of a decode word vector $D=\{d_1, d_2, \ldots, d_n\}$ which is a vector expression of the decode word (a hard decision value) obtained as the decoding result. However, herein, in a case where $x_j=0$ is estimated in a soft decision decoder, $d_j$ is denoted by +1. In a case where $x_j=1$ is estimated, $d_j$ is denoted by -1. $exLLR_j$ indicates a j-th element of an extrinsic value vector $\{exLLR_1, exLLR_2, \ldots, exLLR_n\}$. In addition, in the above Equation (1), the solution diverges to infinity when the decoding success rate φ is 1. In that case, an exceptional process is performed, for example, by setting the extrinsic value to a maximum value.

The decoding success rate φ is not able to be obtained when a correct solution (the transmitted code word) is not known. However, the decoder 27 receiving the channel value does not know the correct solution. Therefore, in an actual process, the decoding success rate φ is estimated based on information with which the decoder 27 can obtain the correct solution. As a method, there is a method of estimating the decoding success rate φ on an assumption that the decoding success rate φ depends on $Dist_{des}$ shown in the following Equation (2). In this method, a relation between $Dist_{des}$ and φ is obtained in advance. Then, the decoding success rate φ is estimated based on the relation and $Dist_{des}$ calculated based on the information obtained by the decoder. Herein, $r_j$ indicates the channel value or a j-th element of a vector $R=\{r_1, r_2, \ldots, r_n\}$ containing a value obtained by adding the channel value and the a priori value as an element, (for example, the extrinsic value obtained by the decoding of another dimension in the product code as described above).

$$Dist_{des} = \sum_{i \in DES} (r_j - d_j)^2 \quad (2)$$

where $DES = \{j \mid (r_j - d_j) \cdot d_j < 0\}$

However, a calculation accuracy of the extrinsic value in the above-described method may be low depending on a state of the channel or a method of generating the product code. In the first embodiment, the decoding success rate φ is estimated using a square Euclidean distance between the channel value (reception vector) and the decode word shown in the following Equation (3) or the information corresponding to the Euclidean distance in place of the above-described $Dist_{des}$.

$$\Sigma(R-D)^2 = \sum_{i=0}^{n-1} r_i^2 + n - 2\sum_{i=0}^{n-1} |r_i| + 4\sum_{r_i d_i < 0} |r_i| \quad (3)$$

In the right side of the above-described Equation (3), the terms other than the last term are values determined by a reception word (the channel value) and the a priori value, and do not depend on the decode word (the decoding result). Therefore, in the first embodiment, as shown in the following Equation (4), the last term in the right side of Equation (3) depending on the decode word is defined as distance information Dist, and the decoding success rate φ is estimated using the distance information. In other words, in the first embodiment, a relation of the decoding success rate φ with respect to a correct decode word (the transmitted code word), a soft input value, and the distance information corresponding to a square Euclidean distance is obtained in advance by simulations. The decoding success rate φ is estimated based on the relation and the distance information calculated based on the decode word obtained by decoding the channel value. Further, the soft input value is a reception word (the channel value) corresponding to the code word which is read from the nonvolatile memory 3 as a soft decision value.

$$Dist = \sum_{r_i d_i < 0} |r_i| \quad (4)$$

In a case where $x_j=0$ is estimated in the soft decision decoding on a certain code constraint in the first embodiment, $d_j$ is denoted by +1. In a case where $x_j=1$ is estimated, $d_j$ is denoted by -1. Then, the distance information is calculated using Equation (4). Subsequently, the decoding success rate φ is obtained from the relation between the distance information and the decoding success rate φ. The extrinsic value under a certain code constraint condition is calculated using Equation (1). The extrinsic value is used as the a priori value in the soft decision decoding of another code constraint. The detailed description on a method of calculating the decoding success rate φ of the first embodiment will be described below.

Hereinafter, the encoding and the decoding of the first embodiment will be described. Herein, the description will be made about an example of the product code which is generated by combining the block codes of two or more dimensions. However, the decoding method of the first embodiment is not limited to the product code, and can be applied to any code as long as the code contains the plurality of constraint conditions. For example, the decoding method of this embodiment can also be applied to the concatenated code.

First, the write process of the first embodiment will be described. The controller 23 instructs the encoder 26 to encode the data at the time of writing the data on the nonvolatile memory 3, and determines a storage space (storage address) of the code word in the nonvolatile memory 3 to instruct the memory I/F 22. The encoder 26 encodes the data on the data buffer 25 to generate the code word based on the instruction from the controller 23. The memory I/F 22 performs control to store the code word to the storage space on the nonvolatile memory 3 instructed from the controller 23.

Figure 2:
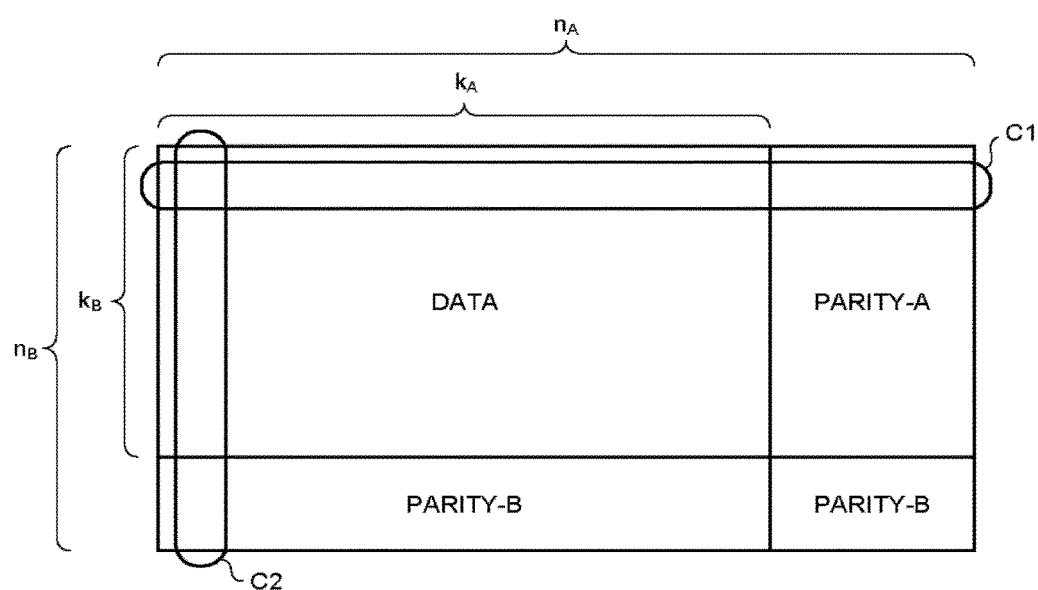
FIG. 2 is a diagram illustrating an exemplary configuration of a product code of the first embodiment.

The encoder 26 generates the product code for example. FIG. 2 is a diagram illustrating an exemplary configuration of the product code of the first embodiment. FIG. 2 illustrates an example in which two-dimensional product code is used. In the example of FIG. 2, the product code is configured by the code word group of two dimensions of the first dimension (a row direction, that is, the horizontal direction illustrated in FIG. 2), and the second dimension (a column direction, that is, the vertical direction with respect to the sheet of FIG. 2). There are plural codes as a first-dimensional code word and a second-dimensional code word forming the product code. In FIG. 2, only one code is assigned to each of a first-dimensional code word C1 and a second-dimensional code word C2. Data of FIG. 2 indicates the user data. Further, in a case where control data used in the memory controller 2 other than the user data is protected by the same product code as the user data, Data indicates the control data to be protected by the product code. The code length of each first-dimensional code word is $n_A$ bits, the number of information bits of each first-dimensional code word is $k_A$ bits, and the number of redundant bits of each first-dimensional code word (that is, Parity-A) is $(n_A-k_A)$ bits. The code length of each second-dimensional code word is $n_B$ bits, the number of information bits of each second-dimensional code word is $k_B$ bits, and the number of redundant bits of each second-dimensional code word (that is, Parity-B) is $(n_B-k_B)$ bits. In addition, a CRC (Cyclic Redundancy Check) bit may be added as a redundant bit of an error detecting code. In the following, the entire code word group illustrated in FIG. 2 is called the product code.

In the following sequence, the product code illustrated in FIG. 2 is generated. The encoder 26 encodes the data of $k_A$ bits using the error correcting code (a first encoding) to generate the Parity-A of $(n_A-k_A)$ bits in order to generate the first-dimensional code word. $n_A$ is the length of the first-dimensional code word. In addition, the encoder 26 encodes the data of $k_B$ bits using the error correcting code (a second encoding) to generate the Parity-B of $(n_B-k_B)$ bits in order to generate the second-dimensional code word. $n_B$ is the length of the second-dimensional code word. In addition, the encoder 26 encodes the data of $k_B$ bits (the second encoding) to generate the Parity-B. The data encoded in the first encoding and the second encoding is the user data received from the host 4 and the CRC bit (the redundant bit of the CRC) generated based on the user data. In addition, the data other than the user data received from the host 4 (for example, the data used in the control of the memory controller 2) may be a target of the first encoding and the second encoding. As the error correcting code used in the first encoding and the second encoding, for example, the block code such as a BCH code and an RS code may be used. The error correcting code used in the first encoding and the second encoding may be equal to each other or not. As illustrated in FIG. 2, the information bits (including the CRC bit in a case where the CRC bit is added) of the product code form the first-dimensional code word and also form the second-dimensional code word, respectively.

The configuration of the code word illustrated in FIG. 2 is an example, and the code word to which the decoding method of the first embodiment is applied is not limited to the example of FIG. 2. In addition, $n_A$, $n_B$, $k_A$, and $k_B$ have been described as a bit number, but $n_A$, $n_B$, $k_A$, and $k_B$ may be a symbol number. The code word to which the decoding method of the first embodiment is applicable may be a product code of three or more dimensions as described above, or may be a code other than the product code. In addition, in the example of FIG. 2, all the bits of the data are protected in two types of the first-dimensional code word and the second-dimensional code word. However, all the bits of the data may be not protected by two types, and at least a part of the data may be protected by two types.

There is no particular restriction on the storage space when the product code illustrated in FIG. 2 is stored into the nonvolatile memory 3. For example, the entire product code is stored in one page. In addition, the first-dimensional code word may be stored in one page, the entire product code may be stored in a plurality of pages, or any other storage methods may be employed.

Next, a process performed at the time of reading the code word from the nonvolatile memory 3 of the first embodiment will be described. The controller 23 designates an address on the nonvolatile memory 3 at the time of reading the cord word from the nonvolatile memory 3 to instruct the memory I/F 22 to read the code word, and instructs the decoder 27 to start the decoding. The memory I/F 22 reads the code word from the nonvolatile memory 3 according to the instruction of the controller 23. The decoder 27 decodes the code word read from the nonvolatile memory 3.

Figure 3:
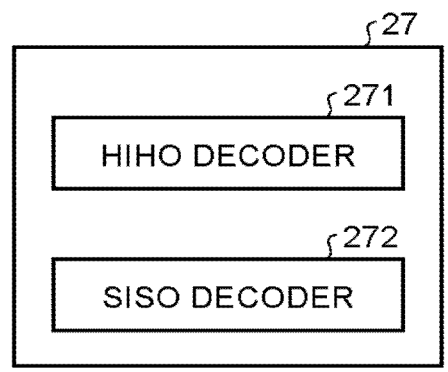
FIG. 3 is a diagram illustrating an exemplary configuration of a decoder of the first embodiment.

FIG. 3 is a diagram illustrating an exemplary configuration of the decoder 27 of the first embodiment. As illustrated in FIG. 3, the decoder 27 includes a HIHO decoder (a hard decision decoder) 271 and a SISO decoder (a soft decision decoder) 272. In the first embodiment, the description has been made on an assumption that the code word of each dimension is generated by the encoding method in which the HIHO decoding is possible. Thus, first, the HIHO decoding is performed, and in a case where the error correction fails in the HIHO decoding, then the SISO decoding is performed.

Figure 4:
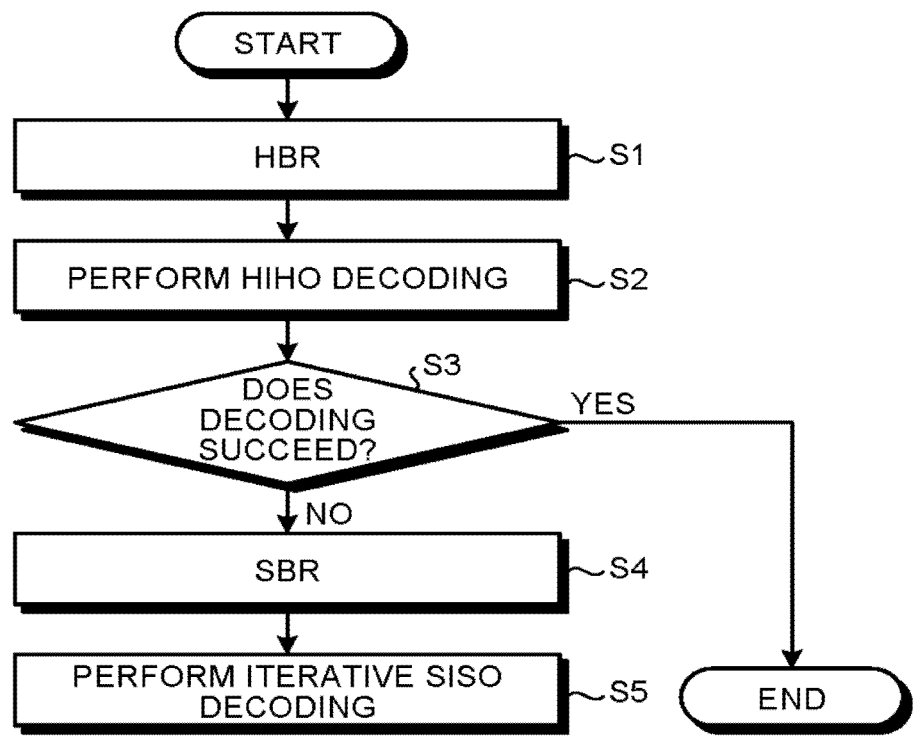
FIG. 4 is a diagram illustrating an example of a read process sequence of the first embodiment.

FIG. 4 is a diagram illustrating an example of a read process sequence of the first embodiment. The controller 23 instructs the memory I/F 22 to designate a read address and to read the code word from the nonvolatile memory 3 by a hard bit read (HBR), and the memory I/F 22 performs the hard bit read (Step S1). The hard bit read is a method of reading each bit of the code word as a hard decision value of 0 or 1. The read code word (the hard decision value) is stored into the data buffer 25. Further, the description herein is made about an example in which the read code word (the hard decision value) is stored into the data buffer 25. However, a buffer for storing the code word (the hard decision value) is provided in the decoder 27, and the code word (the hard decision value) may be stored in the buffer.

In a case where the nonvolatile memory 3 is the NAND memory, electrons are injected such that the number of electrons (the amount of electric charges) of a floating gate corresponds to any one of a plurality of distributions (threshold distributions) according to the data value at the time of writing the data. Herein, for the sake of simplicity, the description will be made about an example of 1 bit/cell in which one memory cell stores one bit. In the case of 1 bit/cell, any one of two distributions corresponds to "0", and the other one corresponds to "1". In a case where a voltage is applied to the memory cell, the current flows when a voltage equal to or more than a voltage value according to the amount of electric charges of the memory cell is applied.

When the voltage less than the voltage value is applied, the current does not flow. Therefore, a voltage of the boundary is determined for each memory cell according to the amount of electric charges of the memory cell. The voltage value determined according to the amount of electric charges of the memory cell is called a threshold voltage (Vth). In an initial state, the electric charges are injected to correspond to any one of two threshold distributions, and a reference read voltage for separating two threshold distributions is applied to the memory cell at the time of reading, so that it is possible to determine whether the data stored in the memory cell is "1" or not.

The hard bit read is a reading operation in which the nonvolatile memory 3 applies the reference read voltage to the memory cell to determine whether the data stored in the memory cell is 1 or 0, and outputs the determined result. Further, a read voltage applied at the time of the hard bit read may be changed according to the reference read voltage.

Returning to the description of FIG. 4, the controller 23 instructs the decoder 27 to perform the HIHO decoding, and the decoder 27 performs the HIHO decoding on the product code stored in the data buffer 25 (Step S2). Specifically, the HIHO decoder 271 performs the HIHO decoding on the product code stored in the data buffer 25 using the hard decision value read from the data buffer 25.

In the HIHO decoding, a decoding (for example, a marginal distance decoding) is performed on the code word input as the hard decision value. The HIHO decoding performed by the HIHO decoder 271 is not limited to the marginal distance decoding, and any HIHO decoding may be used. In a case where the product code illustrated in FIG. 2 is used, the HIHO decoder 271 first decodes sequentially the respective first-dimensional code words of the product code. In a case where there is a code word not succeeding in decoding among the first-dimensional code words of the product code, an error which is correctable in the decoding of the first-dimensional code word is corrected, and the second-dimensional code word is decoded. In a case where there is a code word not succeeding in decoding at the time of the decoding of the second-dimensional code word, an error which is correctable in the decoding of the second-dimensional code word is corrected, and the first-dimensional code word is decoded again. As described above, a process of repeating the decoding of the first-dimensional code word and the decoding of the second-dimensional code word (that is, an iterative decoding) is performed. Further, a specific processing sequence of performing the HIHO decoding on the product code is not limited to the above sequence, and the decoding may be not iteratively performed as the sequence described above.

After Step S2, the HIHO decoder 271 determines whether the decoding succeeds for all the code words of the product code, and notifies the determination result to the controller 23. The controller 23 determines whether the decoding of all the code words of the product code succeeds based on the notification from the HIHO decoder 271 (Step S3). In a case where the decoding of all the code words succeeds (Step S3: YES), the read process is completed. Further, in Step S3, the controller 23 determines whether the decoding of all the code words of at least one dimension of the product code succeeds. In addition, in a case where the redundant bit of the error detecting code such as the CRC bit is added, the code word may also be checked using the error detecting code in the determination on whether the decoding of Step S3 succeeds.

In a case where it is determined that there is a code word failing in the decoding among the code words of the product code (Step S3: NO), the controller 23 instructs the memory I/F 22 to designate a read address and to read the code word from the nonvolatile memory 3 by a soft bit read (SBR). The memory I/F 22 performs the soft bit read in which the code word is read as the soft decision value (Step S4).

In the first embodiment, the input of the SISO decoding in the SISO decoder 272 is the reception word (the channel value) read from the nonvolatile memory 3 by the soft bit read. In other words, in the first embodiment, the reception word (the channel value) read by the soft bit read is used as the soft input value of the SISO decoding in the SISO decoder 272. Further, in the soft bit read, the logarithm of the ratio of the probability (or likelihood) that the value stored in the memory cell of the nonvolatile memory 3 is 0 and the probability (or likelihood) that the value is 1 (that is, LLR (Log Likelihood Ratio) is obtained as the reception word (the channel value).

In addition, in a case where the logarithm of the ratio of the probability that the value stored in the nonvolatile memory 3 is 0 and the probability that the value is 1 is known already, the logarithm is called the a priori value. The SISO decoder 272 receives the channel value (that is, the LLR and the a priori value), and performs the decoding of each code word in each dimension. In other words, the SISO decoder 272 receives the channel value (that is, the LLR and the a priori value), and obtains a most-likely code word among the code words satisfying the code constraint as the decode word. Through the decoding of the code word of each dimension of the SISO decoder 272, the logarithm of the ratio of the probability that each bit of the code word is 0 and the probability that each bit is 1 (that is, log a posteriori probability ratio) is obtained. In the description, the log a posteriori probability ratio is called the a posteriori value.

Figure 5:
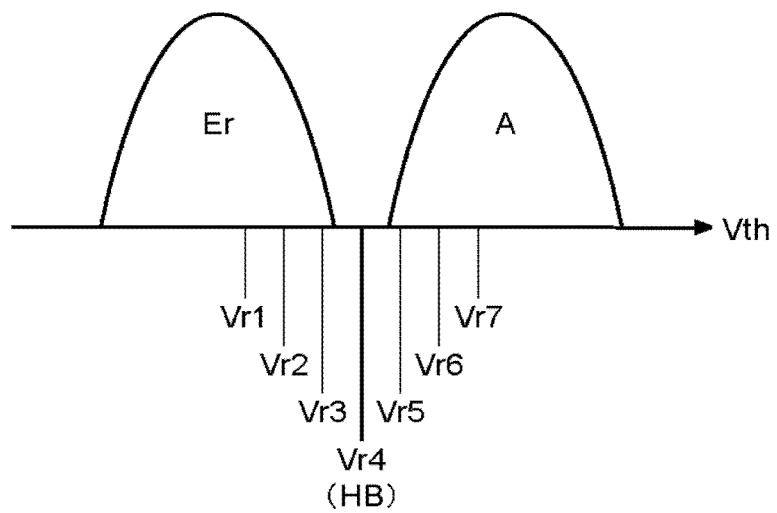
FIG. 5 is a diagram for describing a soft bit read.

FIG. 5 is a diagram for describing the soft bit read. The horizontal axis of FIG. 5 represents threshold voltage, and the vertical axis represent frequency. FIG. 5 illustrates an example of the single-level cell storing 1 bit/cell, in which Er (Erase) distribution on the left side corresponds to the data value "1" and A distribution on the right side corresponds to the data value "0". In the soft bit read, in addition to the reference read voltage used in the hard bit read, the reading is performed using a plurality of read voltages on both sides of the reference read voltage. The example of FIG. 5 shows the soft bit read which is performed using seven read voltages in total. The read voltage denoted by Vr4 (HB) indicates the reference read voltage used in the hard bit read. In the soft bit read, the reading is performed using seven read voltages (Vr4; Vr1, Vr2, and Vr3 lower than Vr4; Vr5, Vr6, and Vr7 higher than Vr4) in total. Further, the number of read voltages in the soft bit read is not limited to "7".

Figure 6:
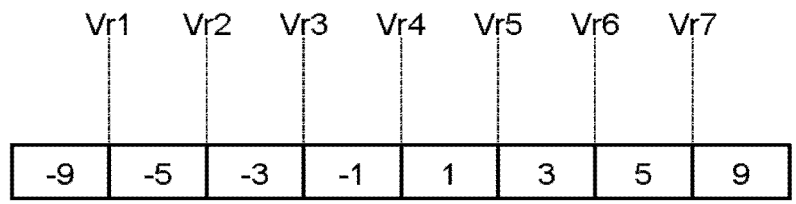
FIG. 6 is a diagram illustrating an example of an LLR table.

Then, for example, the LLR can be obtained from a determination result on whether the threshold voltage of each memory cell is equal to or more than each read voltage using the LLR table. FIG. 6 is a diagram illustrating an example of the LLR table. For example, in a case where it is determined that the threshold voltage of the memory cell is less than Vr1, the LLR becomes −9. In a case where it is determined that the threshold voltage of the memory cell is equal to or more than Vr1 and less than Vr2, the LLR becomes −5. FIG. 6 illustrates an example, and the LLR table is not limited to the example of FIG. 6. In addition, the LLR may be obtained using a calculating formula without using the LLR table. In the description, a procedure from the soft bit read until the translation to the LLR is called a reading of the data from the nonvolatile memory 3 as the soft decision value.

The translation to the LLR from the determination result on whether the threshold voltage of each memory cell is equal to or more than each read voltage may be performed by the memory controller 2, or may be performed by the nonvolatile memory 3. In a case where the conversion is performed by the memory controller 2, for example, the nonvolatile memory 3 outputs information indicating whether the threshold voltage of each memory cell is in any one of eight regions (less than Vr1, equal to or more than Vr1 and less than Vr2, equal to or more than Vr2 and less than Vr3, equal to or more than Vr3 and less than Vr4, equal to or more than Vr4 and less than Vr5, equal to or more than Vr5 and less than Vr6, equal to or more than Vr6 and less than Vr7, and equal to or more than Vr7). Then, the memory I/F 22 obtains the LLR based on the LLR table and the information output from the nonvolatile memory 3, and output the LLR to the decoder 27.

Further, in FIGS. 5 and 6, the description has been made about an example of the single-level cell storing 1 bit/cell. Even in the case of the multi-level cell, the reading is performed for each boundary of the threshold distribution using the plurality of read voltages similarly to the example of the single-level cell. Then, the LLR is calculated based on the reading result using the plurality of read voltages.

Returning to the description of FIG. 4, the controller 23 instructs the decoder 27 to perform an iterative SISO decoding in which the SISO decoding of the first-dimensional code and the SISO decoding of the second-dimensional code are iteratively performed. The decoder 27 performs the iterative SISO decoding (Step S5). Specifically, the SISO decoder 272 performs the SISO decoding on the product code input as the LLR. The detailed description of the iterative SISO decoding will be described below.

In a case where the error correction can be made by the hard bit read and the HIHO decoding through the above-described process, the decoding is completed by performing the hard bit read and the HIHO decoding, so that a high-speed reading can be performed. On the other hand, in a case where the error correction cannot be made by the hard bit read and the HIHO decoding, the error correction capability can be improved by performing the SISO decoding of a high correction capability. Further, in the first embodiment, the hard bit read and the HIHO decoding are performed at the beginning, and in a case where an error cannot be corrected by the hard bit read and the HIHO decoding, the soft bit read and the SISO decoding is performed. However, the soft bit read and the SISO decoding may be performed from the beginning without performing the hard bit read and the HIHO decoding.

Figure 7:
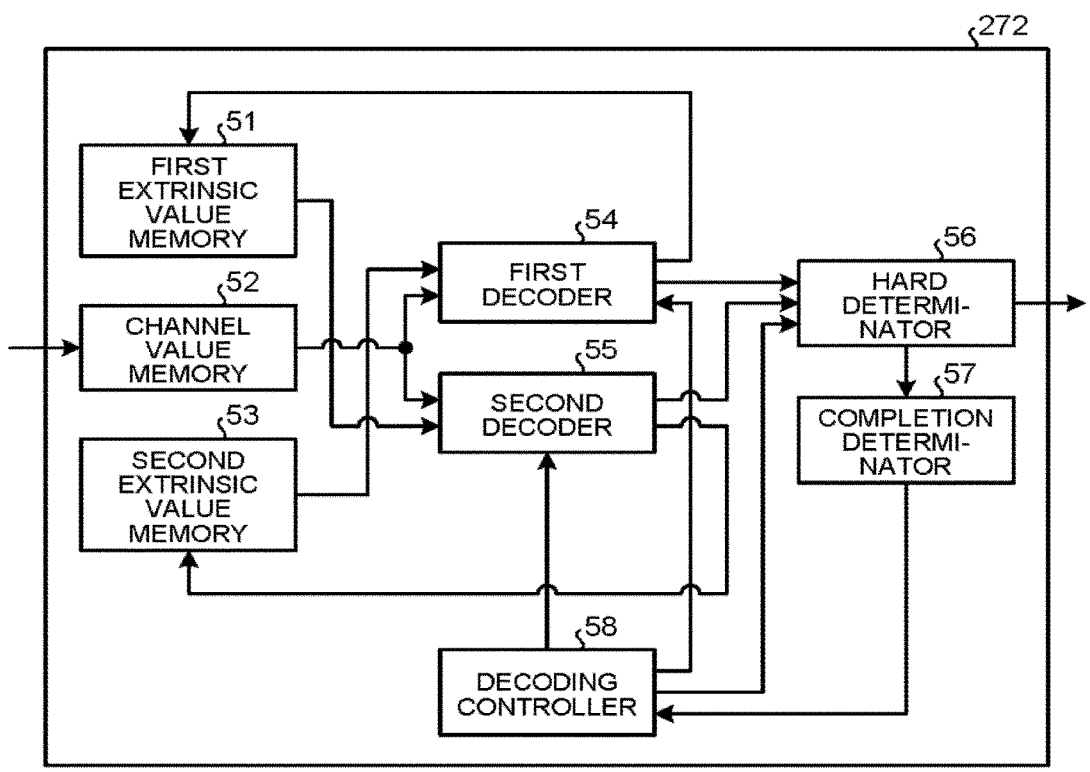
FIG. 7 is a diagram illustrating an exemplary configuration of a SISO decoder.

Next, the SISO decoding of the first embodiment will be described. FIG. 7 is a diagram illustrating an exemplary configuration of the SISO decoder 272. As illustrated in FIG. 7, the SISO decoder 272 includes a first extrinsic value memory 51, a channel value memory 52, a second extrinsic value memory 53, a first decoder 54, a second decoder 55, a hard determinator 56, a completion determinator 57, and a decoding controller 58.

The first decoder 54 performs the SISO decoding on the first-dimensional code word. The second decoder 55 performs the SISO decoding on the second-dimensional code word. Hereinafter, the SISO decoding will be simply referred to as a soft decision decoding. There is no particular constrict on a specific method of the soft decision decoding performed by the first decoder 54 and the second decoder 55.

In the first embodiment, the SISO decoder 272 performs the decoding using the extrinsic value obtained in another dimension as the a priori value. For example, the first decoder 54 uses the extrinsic value (the second extrinsic value) obtained by the decoding of the second-dimensional code word stored in the second extrinsic value memory 53 for the decoding of the first-dimensional code word. In addition, the second decoder 55 uses the extrinsic value (the first extrinsic value) obtained by the decoding of the first-dimensional code word stored in the first extrinsic value memory 51 for the decoding of the first-dimensional code word.

Figure 8:
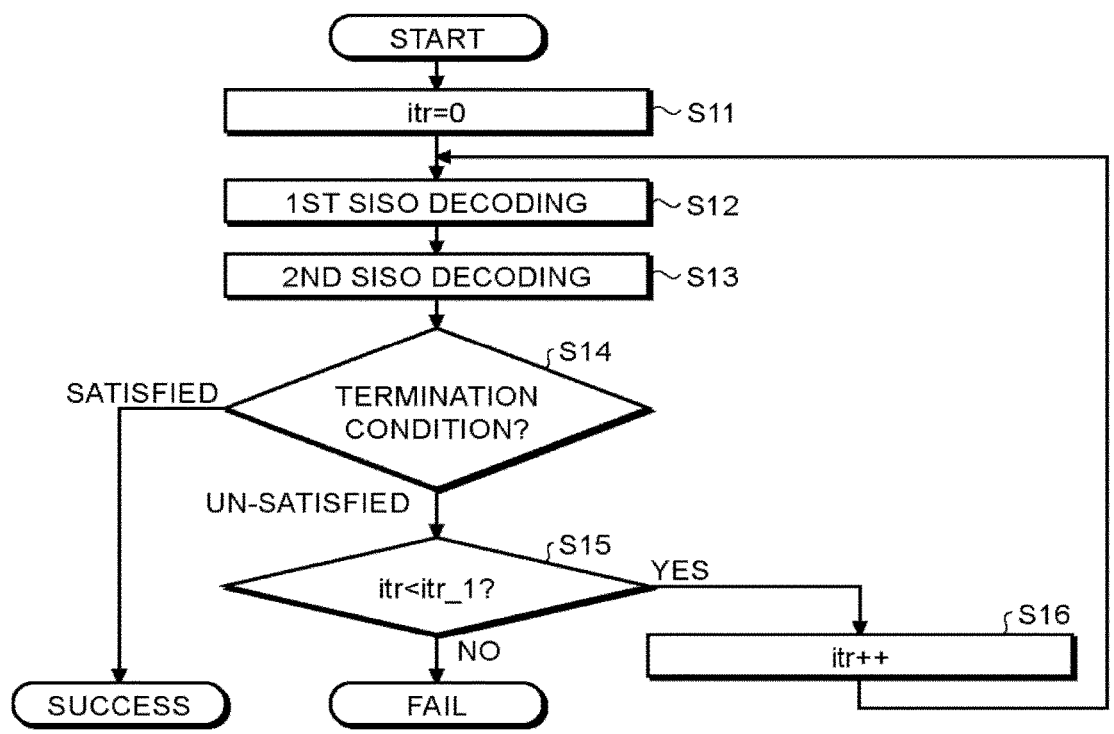
FIG. 8 is a flowchart illustrating an example of an iterative SISO decoding sequence of the first embodiment.

FIG. 8 is a flowchart illustrating an example of an iterative SISO decoding sequence of the first embodiment. First, when instructed to start the SISO decoding from the controller 23, the decoding controller 58 initializes a counter itr of the number of iterations of the SISO decoding to 0 (Step S11). Next, the SISO decoder 272 performs a first SISO decoding process on a first-dimensional code word group of the product code (Step S12). More specifically, the following processes are performed. The decoding controller 58 instructs the first decoder 54 to perform the decoding. When receiving an instruction from the decoding controller 58, the first decoder 54 reads the LLR corresponding to each bit of each first-dimensional code word of the product code from the channel value memory 52. In addition, the first decoder 54 reads the extrinsic value obtained as a result of the SISO decoding in the second dimension corresponding to each bit of each first-dimensional code word from the second extrinsic value memory 53, and sets the extrinsic value to the input of the first SISO decoding as the a priori value in the first dimension. In this case, the a priori value is set to a preset value (for example, 0) at the time of the first SISO decoding process for the first time of the iteration process. Then, the first decoder 54 performs the SISO decoding on each first-dimensional code word using the LLR and the a priori value, and stores the extrinsic value obtained by the SISO decoding into the first extrinsic value memory 51.

Figure 9:
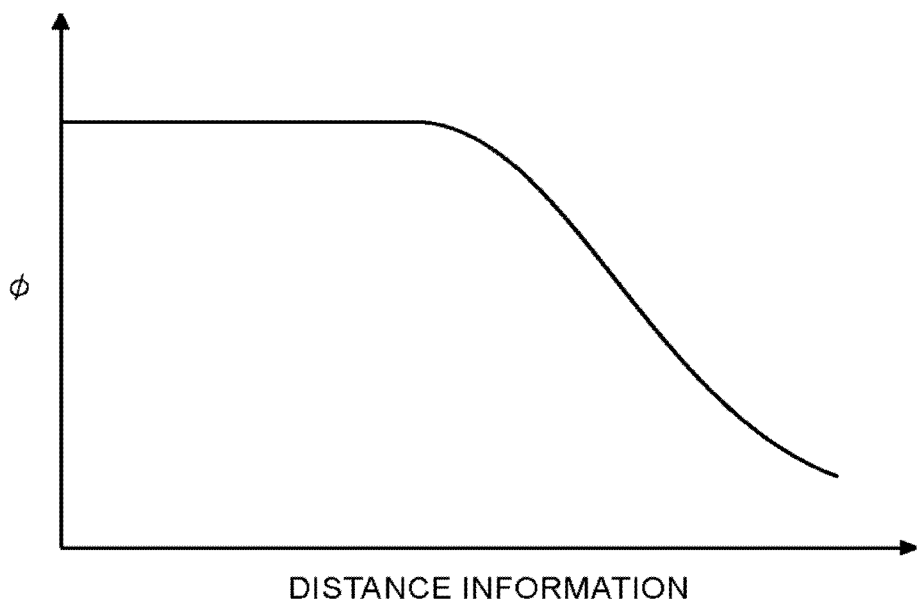
FIG. 9 is a conceptual diagram illustrating an example of a relation between distance information and a decoding success rate φ of the first embodiment.

Herein, a method of calculating the extrinsic value in the first decoder 54 and the second decoder 55 of the first embodiment will be described. In the first embodiment, as described above, the decoding success rate $\phi$ is calculated based on the distance information, and the extrinsic value is calculated by Equation (1) using the decoding success rate $\phi$. FIG. 9 is a conceptual diagram illustrating an example of a relation between the distance information and the decoding success rate $\phi$ of the first embodiment. In the first embodiment, the relation between the distance information and the decoding success rate $\phi$ is obtained in advance by simulations. Further, since the relation between the distance information and the decoding success rate $\phi$ depends on an encoding method, the relation between the distance information and the decoding success rate $\phi$ may be different in the first-dimensional code word and the second-dimensional code word. Therefore, as a table showing the relation between the distance information and the decoding success rate $\phi$, two tables (a decoding table (a first table) of the first-dimensional code word and a decoding table (a second table) of the second-dimensional code word) are prepared. Then, the first decoder 54 and the second decoder 55 each store the corresponding table. In other words, the first decoder 54 stores the first table, and the second decoder 55 stores the second table. In a case where the encoding methods of the first-dimensional code word and the second-dimensional code word are the same, the table may be shared in the first decoder 54 and the second decoder 55. Further, FIG. 9 illustrates a concept, and an actual relation between the distance information and the decoding success rate φ is not limited to the relation illustrated in FIG. 9.

Figure 10:
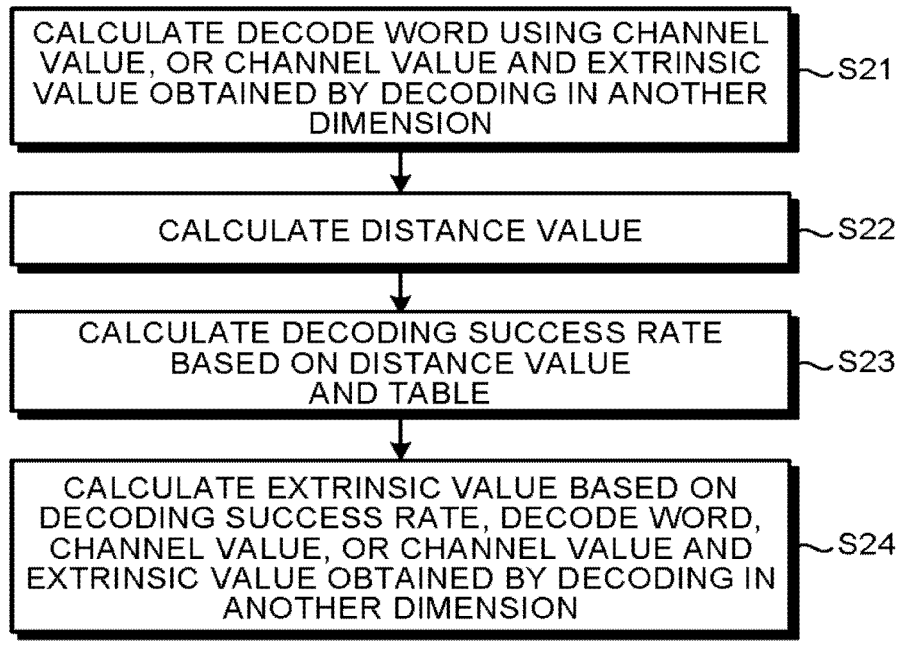
FIG. 10 is a flowchart illustrating an example of a calculation sequence of extrinsic value of the first embodiment.

FIG. 10 is a flowchart illustrating an example of a calculation sequence of the extrinsic value of the first embodiment. Further, the description herein will be made about an operation of the first decoder 54 as an example, and the operation of the second decoder 55 is similar to that of the first decoder 54 except that a target of the decoding is the second-dimensional code word.

The first decoder 54 performs the soft decision decoding using the channel value (or channel value+a priori value (the extrinsic value obtained by the decoding in another dimension)), and calculates the decode word (Step S21). Next, the first decoder 54 calculates the distance information according to the above-described Equation (4) based on the decode word and the channel value (or channel value+a priori value) (Step S22). In Step S22, the first decoder 54 calculates, as shown in Equation (4), a bit location at which an error is corrected in the decode word the decode word (that is, a sum of absolute values of $r_i$ when $r_i d_i<0$ is satisfied) as the distance information. As a way of obtaining "i" satisfying $r_i d_i<0$, $r_i d_i$ may be actually calculated for all the values of "i". Alternatively, "i" satisfying $r_i d_i<0$ may be obtained using an error vector (information indicating a bit location in error) obtained by the soft decision decoding.

Next, the first decoder 54 calculates the decoding success rate φ using the distance information and the above-described table (Step S23). Then, the extrinsic value is calculated according to Equation (1) based on the decoding success rate φ, the decoding result, and the channel value (or channel value+a priori value) (Step S24).

Returning to the description of FIG. 8, after Step S12, the SISO decoder 272 performs a second SISO decoding on a second-dimensional code word group of the product code (Step S13). More specifically, the following processes are performed. The decoding controller 58 instructs the second decoder 55 to perform the decoding. When receiving an instruction from the decoding controller 58, the second decoder 55 reads the LLR corresponding to each bit of each second-dimensional code word of the product code from the channel value memory 52. In addition, the second decoder 55 reads the extrinsic value obtained as a result of the SISO decoding in the first dimension corresponding to each bit of each second-dimensional code word from the first extrinsic value memory 51, and sets the extrinsic value to the input of the first SISO decoding as the a priori value in the second dimension. Then, the second decoder 55 performs the SISO decoding on each code word using the LLR and the a priori value, and stores the extrinsic value obtained by the SISO decoding into the second extrinsic value memory 53. The second extrinsic value is calculated by the sequence described in FIG. 10. In addition, the second decoder 55 outputs the a posteriori value of each bit of each code word obtained by the second SISO decoding toward the hard determinator 56.

The SISO decoder 272 determines whether the SISO decoding is completed based on a hard decision result of the a posteriori value (Step S14). Specifically, the hard determinator 56 performs the hard decision on the a posteriori value of each bit of each code word, and outputs the determination result to the completion determinator 57. The completion determinator 57 determines whether the SISO decoding is completed based on the hard decision result, and outputs the determination result to the decoding controller 58. As a completion determination condition, for example, whether a parity check of the first-dimensional code word is satisfied (no error), or whether a parity check of the second-dimensional code word is satisfied (no error), and in a case where the redundant bit of the error detecting code such as the CRC bit is added, whether a check of the error detecting code is satisfied (no error), or a combination of two or more checks may be used.

In a case where it is determined that the SISO decoding is completed (Step S14: SATISFIED), the SISO decoder 272 completes the SISO decoding as the decoding success. In a case where it is determined that the completion determination condition is not satisfied (Step S14: UN-SATISFIED), the decoding controller 58 determines whether the counter itr of the number of iterations of the SISO decoding is less than a maximum number of iterations itr_1 of the SISO decoding (Step S15). In a case where itr is less than itr_1 (Step S15: YES), the decoding controller 58 increases itr by 1 (Step S16), and the procedure returns to Step S12. In a case where itr is equal to or more than itr_1 (Step S15: NO), the SISO decoding is completed as the decoding fail.

As described above, the first embodiment, in a case where the product code is subjected to the SISO decoding through the iteration process in which the extrinsic value obtained by the decoding of the code word of another dimension at the time of decoding the code word of each dimension is used as the a priori value, the extrinsic value calculated by decoding the code word of each dimension is calculated using the decoding success rate calculated based on the distance information. Therefore, it is possible to realize a high error correction capability through a simple process.

Further, the description in the first embodiment has been made about an example of using the distance information shown in Equation (4). A distance between the decode word shown in Equation (3) and a soft decision input may be used as the distance information.

In addition, the description in the first embodiment has been made about an example in which the product code configured by the first-dimensional code word (a first code word or a first word) and the second-dimensional code word (a second word or a second word) is subjected to the SISO decoding. However, as described, the embodiment is not limited to the product code, and may be applied to a case where a code containing the plurality of constraint conditions is iteratively subjected to the SISO decoding. For example, the embodiment may be applied to the concatenated code configured by the first code word and the second code word.

Second Embodiment

The configuration and the decoding sequence of a storage device according to a second embodiment are the same as those of the storage device 1 of the first embodiment. The second embodiment is different from the first embodiment in that, when a table for making a relation between the distance information and the decoding success rate φ is created by simulations, the decoding success rate φ is necessarily set to a non-zero value.

In the method of calculating the decoding success rate φ described in the first embodiment, even in a case where the decoding success rate φ is not 0 in strictly speaking, the decoding success rate φ may be 0 due to a quantization error and a shortage in number of simulations. In such a case, even in a case where the correct decode word is found out, the decoding success rate φ becomes 0 (that is, the extrinsic value becomes 0). Therefore, the fact that the correct decode word is found out cannot be reflected on the following iteration, and as a result the decoding may fail.

In addition, even when the decoding success rate ϕ is not 0, in a case where the value is relatively small, the fact that the correct decode word is found out cannot sufficiently be reflected on the later iteration in the finite number of iterations, and as a result the decoding may fail in some cases.

In this way, due to the quantization error and the shortage in number of iterations, the influence cannot be sufficiently reflected on the later iteration regardless of the fact that the correct decode word (the transmitted code word) is found out, and as a result the decoding may fail. In such a case, there is a possibility to increase an error floor.

Therefore, in the second embodiment, when the table for making a relation between the distance information and the decoding success rate ϕ (that is, the decoding table (the first table) of the first-dimensional code word and the decoding table (the second table) of the second-dimensional code word in the first embodiment) is created by simulations, the decoding success rate ϕ is set to necessarily be a non-zero value.

Herein, the description will be made about an exemplary method of creating a table for making a relation between distance information D_ied and the decoding success rate ϕ (hereinafter, referred to as a decoding success rate table). Further, a method of creating the decoding success rate table may be the same as the decoding table (the first table) of the first-dimensional code word and the decoding table (the second table) of the second-dimensional code word.

Figure 11:
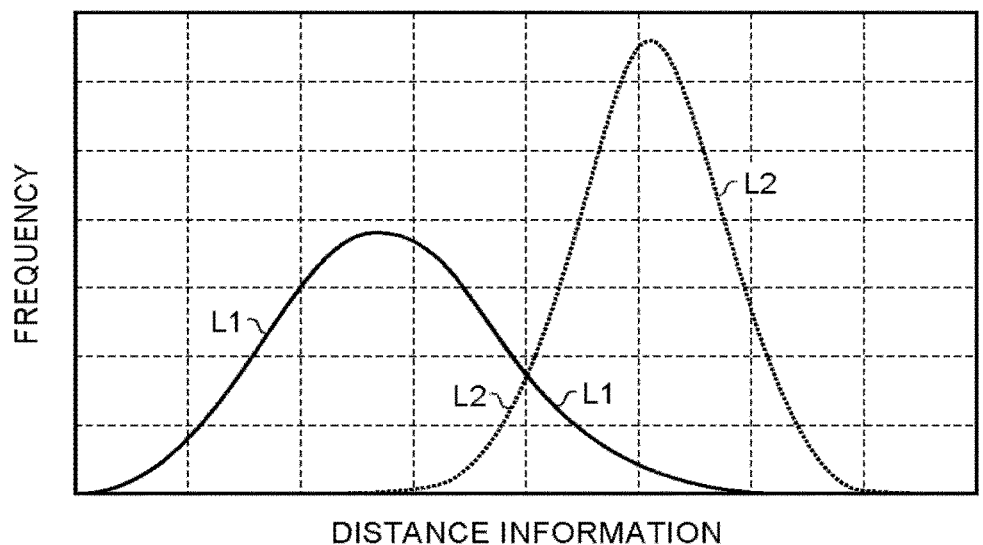
FIG. 11 is histogram illustrating results obtained by simulating the decoding on each component code.

When the decoding success rate table is created, first a simulation of decoding is performed on each component. FIG. 11 is a histogram illustrating results obtained by simulating the decoding on each component code. In FIG. 11, the horizontal axis represents the distance information D_ied, and the vertical axis represents a frequency. In addition, in FIG. 11, the solid line L1 indicates a frequency when the decoding succeeds (a decoding success frequency), and the broken line L2 indicates a frequency when the decoding fails (a decoding fail frequency).

Next, the decoding success rate ϕ for each piece of the distance information D_ied is calculated using the result obtained by the simulation. The decoding success rate ϕ for each piece of the distance information D_ied can be calculated by subtracting the decoding success frequency from the sum of the decoding success frequency and the decoding fail frequency (that is, the number of simulations) for each piece of the distance information D_ied. As a result, the decoding success rate table associating the distance information D_ied and the decoding success rate ϕ is created.

Figure 12:
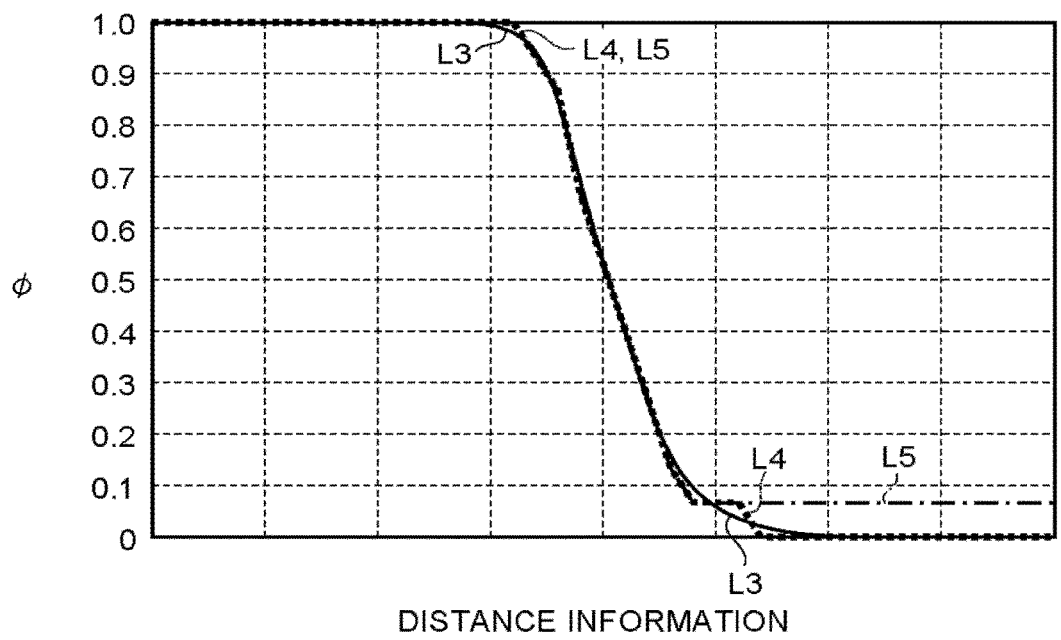
FIG. 12 is a diagram graphically illustrating a decoding success rate table created in a second embodiment.

FIG. 12 is a diagram graphically illustrating the created decoding success rate table. In FIG. 12, the horizontal axis represents the distance information D_ied, and the vertical axis represents the decoding success rate ϕ. In addition, in FIG. 12, the solid line L3 indicates the decoding success rate ϕ when the quantization is not made, the broken line L4 indicates the decoding success rate ϕ when the quantization is made at 4 bits, and the chain line L5 indicates the decoding success rate ϕ which is set in the second embodiment. Further, in FIG. 12, each decoding success rate ϕ is normalized according to a quantization bit width such that a maximum value of the decoding success rate ϕ becomes 1. For example, in a case where the quantization bit width is 4 bits, the decoding success rate ϕ is normalized by subtracting the value obtained by the quantization from 15 ($=2^n-1$).

As plotted by the solid line L3 and the broken line L4 in FIG. 12, even in a case where the decoding success rate ϕ is not 0 in strictly speaking (see L3), ϕ may be calculated to be 0 (see L4) due to the influence of the quantization error and the shortage in number of simulations when the decoding success rate table is created.

Therefore, in the second embodiment, the decoding success rate ϕ having a non-zero value is set with respect to the distance information D_ied when the calculated decoding success rate ϕ is smaller than a certain value (including ϕ=0) as plotted by the chain line L5 of FIG. 12.

A certain value (a threshold) for determining whether the decoding success rate ϕ is set with a preset non-zero value in place of the decoding success rate ϕ obtained by calculation is, for example, a value obtained by normalizing a minimum unit in quantization using a maximum value in a case where the calculated decoding success rate ϕ is quantized and normalized. For example, in a case where the quantization bit width is n (n is a positive integer) bits, the certain value (the threshold) may be set to a value $(1/(2^n-1))$ obtained by normalizing a minimum unit "1" in quantization using a maximum value "$2^n-1$".

In addition, the decoding success rate ϕ having a non-zero value with respect to the distance information D_ied when the calculated decoding success rate ϕ is smaller than the certain value is, for example, the value $(1/(2^n-1))$ obtained by normalizing the unit in quantization using the maximum value in a case where the quantization bit width is n bits similarly to the above-described certain value (the threshold).

As described above, according to the second embodiment, since the decoding success rate ϕ having a non-zero value is set with respect to the distance information D_ied when the calculated decoding success rate ϕ is smaller than the certain value, so that the influence of the fact that the correct decode word is found out can be sufficiently reflected on the later iteration. Therefore, it is possible to reduce a probability of the failing in decoding even though the correct decode word is found out.

Further, since the other configurations, operations, and effects are the same as those of the first embodiment, the redundant descriptions will not be repeated herein.

Third Embodiment

Figure 13:
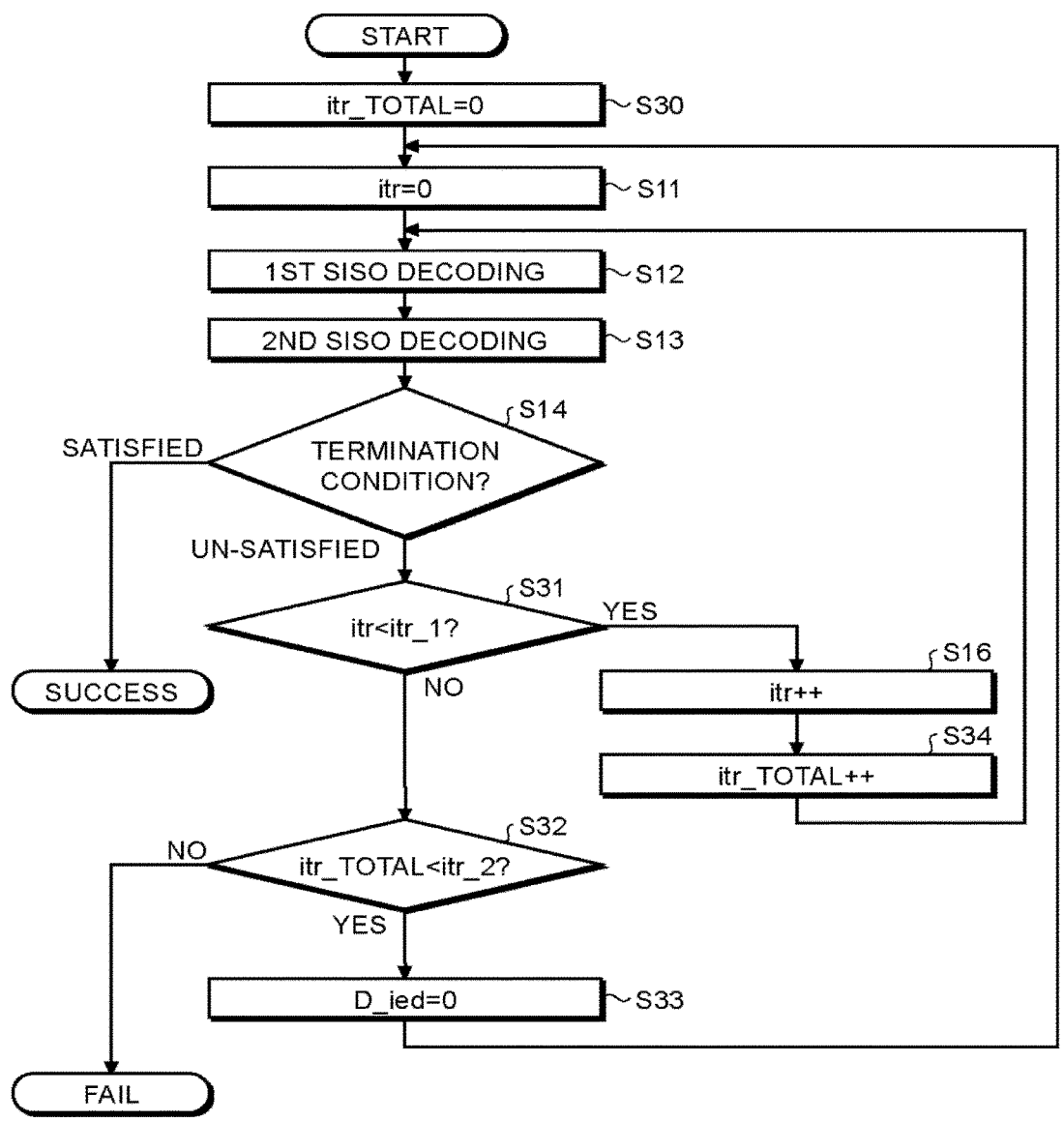
FIG. 13 is a flowchart illustrating an example of an iterative SISO decoding sequence of a third embodiment.

FIG. 13 is a flowchart illustrating an example of an iterative SISO decoding sequence of a storage device according to a third embodiment. In FIG. 13, the same configurations as those of FIG. 8 are denoted by the same symbols. In addition, the configuration of the storage device and a decoding sequence in the third embodiment are the same as those of the storage device 1 of the first or second embodiment.

As described in the second embodiment, even in a case where the decoding success rate ϕ is set to necessarily be a non-zero value in the decoding success rate table, the decoding may not succeed due to the shortage in number of iterations even though the correct decode word is found out. Therefore, in the third embodiment, in a case where the decoding does not succeed even when the decoding is performed a certain number of times, a maximum value of the system is set to the extrinsic value. In a method of setting a maximum value of the system to the extrinsic value, the extrinsic value is calculated using Equation (1) in which the decoding success rate ϕ is set to 1. Therefore, it is possible to avoid that the decoding fails even though the correct decode word (the transmitted code word) is found out.

In the flowchart illustrated in FIG. 13, a maximum value of the system is set to the extrinsic value in a case where the decoding does not succeed even when the decoding is performed a certain number of times. In the operation illustrated in FIG. 13, a counter itr_TOTAL which counts a total number of decoding is first initialized to 0 (Step S30). Then, the same operations as those in Steps S11 to S14 illustrated in FIG. 8 are performed. Then, in a case where it is determined in Step S14 that the SISO decoder 272 does not satisfy a completion condition of the SISO decoding (Step S14: UN-SATISFIED), the decoding controller 58 determines whether the counter itr of the number of iterations of the SISO decoding is less than a certain number itr_1 of iterations of the SISO decoding (Step S31). In a case where itr is less than itr_1 (Step S31: YES), the decoding controller 58 increases itr by 1 (Step S16), and increases itr_TOTAL by 1 (Step S34), and then the procedure returns to Step S12. In a case where itr is equal to or more than itr_1 as a result of the determination in Step S31 (Step S31: NO), it is determined whether itr_TOTAL is less than a preset upper limit itr_2 of times of the SISO decoding (Step S33). In a case where itr_TOTAL is less than the upper limit itr_2 of times (Step S32: YES), the decoding controller 58 sets the distance information D_ied to 0 (Step S33) so as to set the decoding success rate φ specified based on the distance information D_ied to a maximum value "1". Thereafter, the decoding controller 58 returns the procedure to Step S11 to initialize the counter itr of the number of iterations of the SISO decoding to 0, and performs the subsequent operations. In addition, in a case where itr_TOTAL is equal to or more than the upper limit itr_2 of times (Step S32: NO), the decoding controller 58 completes the SISO decoding as the decoding fail.

Through the operations as described above, the maximum value of the system is set to the extrinsic value in a case where the decoding does not succeeds even though the decoding is performed a certain number of times. Therefore, it is possible to avoid that the decoding fails even though the correct decode word is found out.

Further, since the other configurations, operations, and effects are the same as those of the first or second embodiment, the redundant descriptions will not be repeated herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller, which is connectable to a host, configured to control a nonvolatile memory, the memory controller comprising:
    an encoder configured to generate a first word and a second word based on user data received from the host;
    a memory interface configured to write the generated first word and second word in the nonvolatile memory; and
    a decoder configured to comprise:
        a first decoder which stores a first table, the first table indicating a correspondence between first distance information indicating a square Euclidean distance between a first decode word and a first soft input value and a first decoding success rate indicating a probability of a decoding result that the first decode word is correct, calculates the first distance information based on the first word read as a soft decision value from nonvolatile memory via the memory interface, specifies the first decoding success rate associated with the first distance information from the first table, calculates first extrinsic value based on the first decoding success rate, and outputs the first extrinsic value, and
        a second decoder which stores a second table, the second table indicating a correspondence between second distance information indicating a square Euclidean distance between a second decode word and a second soft input value and a second decoding success rate indicating a probability of a decoding result that the second decode word is correct, calculates the second distance information based on an addition result of the second word read as a soft decision value from the nonvolatile memory via the memory interface and the first extrinsic value, specifies the second decoding success rate associated with the second distance information from the second table, calculates second extrinsic value based on the second decoding success rate, and outputs the second extrinsic value,
    wherein a minimum value of the first decoding success rate registered in the first table is a first non-zero value, and
    wherein a minimum value of the second decoding success rate registered in the second table is a second non-zero value.

2. The memory controller according to claim 1, wherein the first distance information Dist1 is a value calculated by the following equation, $$Dist1 = \sum_{r_i d_i < 0} |r_i|$$

(where, $r_i$ is an i-th element of a vector having the first soft input value or a value obtained by adding the first soft input value and a first priori value as an element, and $d_i$ is an i-th element of a decode word vector which is a vector expression of the first decode word), and
wherein the second distance information Dist2 is a value calculated by the following equation, $$Dist2 = \sum_{r_j d_j < 0} |r_j|$$

(where, $r_j$ is a j-th element of a vector having the second soft input value or a value obtained by adding the second soft input value and a second priori value as an element, and $d_j$ is a j-th element of a decode word vector which is a vector expression of the second decode word).

3. The memory controller according to claim 2, wherein the second decoder calculates the second distance information based on the addition result obtained by adding the second word and the first extrinsic value using the first extrinsic value as a priori value, and
wherein, in a case where the second extrinsic value is calculated by the second decoder, the first decoder calculates the first distance information based on an addition result obtained by adding the first word and the second extrinsic value using the second extrinsic value as a priori value.

4. The memory controller according to claim 1,
wherein the first decoding success rate registered in the first table is a value which is obtained by normalizing a first quantized value using a first maximum value of a first quantization bit width,
wherein the second decoding success rate registered in the second table is a value which is obtained by normalizing a second quantized value using a second maximum value of a second quantization bit width,
wherein the first quantized value is a value which is obtained by normalizing a minimum unit of the first quantization using the first maximum value, and
wherein the second quantized value is a value which is obtained by normalizing a minimum unit of the second quantization using the second maximum value.

5. The memory controller according to claim 1,
wherein the first decoder performs a first decoding using a first reception word corresponding to the first word read from the nonvolatile memory as the first soft input value, calculates the first distance information based on a first decode word obtained by the first decoding, specifies the first decoding success rate associated with the first distance information from the first table, calculates the first extrinsic value based on the first decoding success rate, and outputs the first extrinsic value, and
wherein the second decoder performs a second decoding using an addition result of a second reception word corresponding to the second word read from the nonvolatile memory and the first extrinsic value as the second soft input value, calculates the second distance information based on a second decode word obtained by the second decoding, specifies the second decoding success rate associated with the second distance information from the second table, calculates the second extrinsic value based on the second decoding success rate, and outputs the second extrinsic value.

6. The memory controller according to claim 5,
wherein the decoder includes a completion determinator which determines whether the decoding is completed based on a decoding result of the second decoding,
wherein the first decoder iterates the first decoding until the completion determinator determines that the decoding is completed,
wherein the second decoder iterates the second decoding until the completion determinator determines that the decoding is completed, and
wherein, in a case where the second extrinsic value is calculated, the first decoder uses an addition result of the first reception word and the second extrinsic value as the first soft input value.

7. The memory controller according to claim 6, wherein, in a case where the completion determinator determines that the decoding is completed as a result of iterating the first decoding of the first decoder and the second decoding of the second decoder a certain number of times, the decoder sets the first distance information and the second distance information to zero.

8. The memory controller according to claim 1,
wherein the first word is a first-dimensional code word which configures a product code, and
wherein the second word is a second-dimensional code word which configures the product code.

9. A method of controlling a nonvolatile memory, the method comprising:
generating a first word and a second word based on user data received from a host;
writing the generated first word and the second word in the nonvolatile memory;
performing a first decoding; and
performing a second decoding,
wherein the first decoding includes:
calculating first distance information based on the first word read as a soft decision value from the nonvolatile memory, the first distance information indicating a square Euclidean distance between a first decode word and a first soft input value,
specifying a first decoding success rate associated with the first distance information from a first table, the first table indicating a correspondence between the first distance information and a first decoding success rate, the first decoding success rate indicating a probability of a decoding result that the first decode word is correct, and
calculating a first extrinsic value based on the first decoding success rate and output the first extrinsic value,
wherein the second decoding includes:
calculating second distance information based on an addition result of the second word read as a soft decision value from the nonvolatile memory and the first extrinsic value,
specifying a second decoding success rate associated with the second distance information from a second table, the second table indicating a correspondence between the second distance information indicating a square Euclidean distance between a second decode word and a second soft input value and a second decoding success rate indicating a probability of a decoding result that the second decode word is correct, and
calculating a second extrinsic value based on the second decoding success rate and outputting the second extrinsic value,
wherein a minimum value of the first decoding success rate registered in the first table is a first non-zero value, and
wherein a minimum value of the second decoding success rate registered in the second table is a second non-zero value.

10. The method according to claim 9,
wherein the first distance information Dist1 is a value calculated by the following equation, $$Dist1 = \sum_{r_i d_i < 0} |r_i|$$

(where, $r_i$ is an i-th element of a vector having the first soft input value or a value obtained by adding the first soft input value and a first priori value as an element, and $d_i$ is an i-th element of a decode word vector which is a vector expression of the first decode word), and
wherein the second distance information Dist2 is a value calculated by the following equation, $$Dist2 = \sum_{r_j d_j < 0} |r_j|$$

(where, $r_j$ is a j-th element of a vector having the second soft input value or a value obtained by adding the second soft input value and a second priori value as an element, and $d_j$ is a j-th element of a decode word vector which is a vector expression of the second decode word).

11. The method according to claim 10, wherein the second distance information is calculated based on an addition result obtained by adding the second word and the first extrinsic value using the first extrinsic value as a priori value, and
wherein, in a case where the second extrinsic value is calculated by the second decoding, the first distance information is calculated based on an addition result obtained by adding the first word and the second extrinsic value using the second extrinsic value as a priori value.

12. The method according to claim 9, wherein the first decoding success rate registered in the first table is a value which is obtained by normalizing a first quantized value using a first maximum value of a first quantization bit width,
wherein the second decoding success rate registered in the second table is a value which is obtained by normalizing a second quantized value using a second maximum value of a second quantization bit width,
wherein the first quantized value is a value which is obtained by normalizing a minimum unit of the first quantization using the first maximum value, and
wherein the second quantized value is a value which is obtained by normalizing a minimum unit of the second quantization using the second maximum value.

13. The method according to claim 9, wherein the first decode word is obtained by decoding using a first reception word corresponding to the first word read from the nonvolatile memory as the first soft input value,
wherein the first distance information is calculated based on the obtained first decode word,
wherein the second decode word is obtained by decoding using an addition result of a second reception word corresponding to the second word read from the nonvolatile memory and the first extrinsic value as the second soft input value,
wherein the second distance information is calculated based on the obtained second decode word.

14. The method according to claim 13, further comprising:
determining whether a decoding is completed based on a decoding result of the second decoding, and
iterating the first decoding and the second decoding until it is determined that the decoding is completed,
wherein, in a case where the second extrinsic value is calculated, an addition result of the first reception word and the second extrinsic value is used as the first soft input value.

15. The method according to claim 14, further comprising:
in a case where it is determined that the decoding is completed as a result of iterating the first decoding and the second decoding a certain number of times, setting the first distance information and the second distance information to zero.

16. The method according to claim 9, wherein the first word is a first-dimensional code word which configures a product code, and
wherein the second word is a second-dimensional code word which configures the product code.

* * * * *